(12) United States Patent
Iijima et al.

(10) Patent No.: US 6,214,772 B1
(45) Date of Patent: Apr. 10, 2001

(54) PROCESS FOR PREPARING POLYCRYSTALLINE THIN FILM, PROCESS FOR PREPARING OXIDE SUPERCONDUCTOR, AND APPARATUS THEREFOR

(75) Inventors: Yasuhiro Iijima; Mariko Hosaka; Nobuo Tanabe; Nobuyuki Sadakata; Takashi Saitoh, all of Tokyo (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 09/091,231

(22) PCT Filed: Oct. 23, 1997

(86) PCT No.: PCT/JP97/03827

§ 371 Date: Jun. 18, 1998

§ 102(e) Date: Jun. 18, 1998

(87) PCT Pub. No.: WO98/17846

PCT Pub. Date: Apr. 30, 1998

(30) Foreign Application Priority Data

Oct. 23, 1996 (JP) .................................................. 8-281081

(51) Int. Cl.$^7$ ........................ C23C 14/46; H01L 39/24
(52) U.S. Cl. .................... 505/475; 505/480; 505/731; 204/192.11; 204/192.24; 427/62
(58) Field of Search ..................... 505/475, 434, 505/731, 480; 204/192.11, 192.22, 192.24, 298.04, 298.09; 427/62

(56) References Cited

U.S. PATENT DOCUMENTS 4,988,670 * 1/1991 Itozaki et al. ............................ 505/1
5,080,455 * 1/1992 King et al. ........................... 427/162
5,229,358 * 7/1993 Kumar .................................... 505/1
5,462,921 * 10/1995 Adachi et al. ....................... 505/473
5,650,378 7/1997 Iijima et al. .
5,660,740 * 8/1997 Komino .......................... 204/298.09

FOREIGN PATENT DOCUMENTS 0 591 588  4/1994  (EP) .
775 783  1/1935  (FR) .
5-67517  * 3/1993  (JP) .

OTHER PUBLICATIONS

Iijima et al, Appl. Phys. Lett. 60(6) pp. 769–771, Feb. 1992.*
Gnanarajan, S. et al., "Biaxially Aligned Buffer Layers of Cerium Oxide, Yttria Stabilized Zirconia, and Their Bilayers," *Appl. Phys. Lett.*, vol. 70, No. 21, pp. 2816–2818, (May 26, 1997), XP000658434.

* cited by examiner

*Primary Examiner*—Roy V. King
*Assistant Examiner*—Bret Chen
(74) *Attorney, Agent, or Firm*—Oblon, Spivak, McClelland, Maier & Neustadt, P.C.

(57) ABSTRACT

A method is presented for making a polycrystalline thin film (B) by depositing particles emitted from a target (36) on a substrate base (A) to form the film (B) constituted by the target material while concurrently irradiating the depositing particles with an ion beam generated by an ion source (39) at an angle of incidence, in a range of 50 to 60 degrees to a normal (H) to a film surface, and maintaining a film temperature at less than 300 degrees Celsius. This method is effective in producing an excellent alignment of crystal axes of the grains in the film when the film thickness exceeds 200 nm. The target material includes yttrium-stabilized zirconia but other material can also be used. A layer (C) of a superconducting substance formed on top of the polycrystalline thin film (B) produces a superconducting film (22) exhibiting excellent superconducting properties.

10 Claims, 11 Drawing Sheets

PROCESS FOR PREPARING POLYCRYSTALLINE THIN FILM, PROCESS FOR PREPARING OXIDE SUPERCONDUCTOR, AND APPARATUS THEREFOR

This is a 371 application of PTC/JP97/03827, filed Oct. 23, 1997.

BACKGROUND OF THE INVENTION

1. Field of the Invention

The present invention relates to a method for making a polycrystalline thin film having a highly oriented grain structure and a method for making oxide superconductor on such a thin film base and an apparatus for making said polycrystalline thin film.

2. Description of the Related Art

Oxide superconducting materials discovered in recent years are excellent super-conductors having a critical temperature higher than the liquid nitrogen temperature, but many problems remain to be resolved before such oxide superconducting materials can be used as practical superconductor devices. One such problem is that the critical current density is low for these oxide superconductors.

The problem of low critical current density is caused largely by the anisotropic electrical properties of the crystals in the superconductor themselves, and especially, it is known that an electrical current can flow relatively easily in the directions of a- and b-axes but has a difficulty flowing in the c-axis direction. Therefore, to deposit an oxide superconductor on a substrate base and to use such a material as a superconducting device, it is necessary to form an oxide superconducting layer on a substrate base whose grain structure has a highly-developed controlled orientation, and furthermore, the a- and b-axes must be made to align in the direction of the current flow while the c-axis is oriented in another direction which does not impede the current flow.

Various methods have been tried in the past to deposit oxide superconductors of a suitable orientation on a substrate such as plate and metal tape. One such method currently in use is a thin film growth technique based on sputtering of superconducting oxide material on a single crystal substrate base of a material such as MgO or $SrTiO_3$ which have similar crystal structures to oxide superconductors.

Using such a single crystal substrate material to grow a thin film by sputtering, for example, it is possible to deposit a single crystal layer having an excellent directionality in the crystal orientation, and it is known that a high critical current density exceeding several hundred thousand of amperes per square centimeter can be achieved in the superconducting oxide layer formed on the single crystal base.

To use the oxide superconductor as an electrical conductor, it is necessary to deposit a uniformly oriented superconducting layer on a longitudinally extending base, for example a tape base. However, when such a layer is deposited on a metal tape, because the substrate metal itself is a polycrystalline material and its crystal structure is quite different from that of the oxide material, it is virtually impossible to produce a highly oriented superconducting layer. Additionally, because of heat treatments necessary to develop superconducting properties, diffusional reactions which can occur between the superconducting oxide layer and the metal tape base disturb the interface structure and degrade the superconducting properties.

For these reasons, general practice is to form a superconducting layer on top of a sputtered intermediate layer, comprised by materials, such as MgO or $SrTiO_3$, on a metal tape. However, the problem with a superconducting oxide layer formed on such an intermediate layer is that it exhibits only a low critical current density (for example, several thousand to tens of thousand $A/cm^2$). This problem is thought to be due to the following causes.

FIG. 15 shows a cross sectional view of a sputtered superconducting oxide layer 3 formed on top of an intermediate layer 2 on a base 1 of a metal tape, for example. The superconducting oxide layer 3 is a polycrystalline layer and is comprised by numerous randomly oriented grains 4. Close examination of the individual grains 4 reveals that although the c-axis of each grain 4 is at right angles to the base, both a- and b-axes are oriented in random directions.

When the a- and b-axes are randomly oriented in the neighboring grains, quantum coupling in the superconducting state is destroyed at the grain boundaries which are irregular lattice structures, and the result is that the superconducting properties, especially the critical current density become seriously affected.

Also, because the underlying intermediate layer 2 is polycrystalline without the uniform orientation of a- and b-axes, the superconducting oxide layer 3 becomes a polycrystalline layer of randomly oriented a- and b-axes, and the growth of the layer 3 occurs in conformity with the underlying random orientation nature of the intermediate layer 2.

Technology of growing an oriented film of various materials on polycrystalline substrate is utilized in fields other than the above-mentioned oxide superconductor field. For example, they are useful in optical thin films, opto-magnetic discs, circuit boards, high frequency waveguides and signal filters, as well as in cavity resonators, but in every field, an important requirement is to produce a polycrystalline film having a highly developed crystal orientation of a uniform quality. In other words, the quality of the thin film for optical, magnetic and circuit applications would be expected to be better if the film can be formed on a polycrystalline base having a controlled grain orientation, and it would be even more desirable if a properly oriented films for such applications can be deposited directly on the substrate base.

For these reasons, the present inventors have been investigating processes of forming a polycrystalline layer of yttrium-stabilized zirconia (abbreviated to YSZ hereinbelow) on a metal tape and subsequently depositing superconducting oxide layer on the polycrystalline layer to produce an oxide superconductor of superior properties.

These efforts have resulted in publications of the following patent applications, for producing a polycrystalline film of a controlled orientation and oxide superconductors formed thereon: JPA, First Publication, H4-329865 (Application No. H3-126836); JPA, First Publication, H4-331795 (Application No. H3-126837); and JPA, First Publication, H6-145977 (Application No. H4-293464).

These studies have shown that irradiating ion beams at an inclined angle to the YSZ layer being formed enabled to obtain a superior orientation control of the grains.

Concurrent with these investigations, studies have been conducted on how to produce polycrystalline thin films and oxide superconductors on an extending or large area substrate. As a result of the accumulated efforts, not only a method of making polycrystalline thin films to provide a superior control over the crystal orientation but also a method of forming an oxide superconductor of superior superconducting properties on top of such a substrate base have been developed.

SUMMARY OF THE INVENTION

It is an object of the present invention to continue to enhance the work carried out to date by providing a method for making a highly oriented polycrystalline substrate base and then to form an oxide superconductor of controlled crystal orientation on the substrate base so that not only the c-axes of the polycrystals are orientated at right angles to the film surface but the a- and b-axes are also well-aligned in a horizontal direction parallel to the film surface, thereby leading to an oxide superconductor having a superior critical current density and improved superconducting properties. Another object is to present a deposition apparatus to be used with the method.

The object has been achieved in a method for making a polycrystalline thin film by depositing particles emitted from a target on a substrate base so as to form a polycrystalline thin film comprised by elements constituting the target while concurrently irradiating the particles being deposited on the substrate base with an ion beam generated by an ion source, at an angle of incidence in a range of 50 to 60 degrees to a normal to a film surface, and maintaining a film temperature at not more than 300 degrees Celsius.

In the method presented above, the target may be comprised by yttrium-stabilized zirconia.

In the method presented above, it is preferable that the polycrystalline thin film has a film thickness of not less than 200 nanometers.

The object has been achieved also in a method for making an oxide superconducting body by performing the steps disclosed in claim 1 and then depositing a superconducting layer on top of the polycrystalline thin film.

In the above method, the target may be comprised by yttrium-stabilized zirconia.

In the above method, it is preferable that the polycrystalline thin film has a film thickness of not less than 200 nanometers.

According to the present method, a crystal aligning ion beam is irradiated at an angle of incidence of between 50 to 60 degrees to a normal to the film surface onto the particles which are emitted by the target and being deposited on the substrate base, maintained at a deposit temperature of not more than 300° C. This process enables to produce a YSZ thin film comprised by polycrystalline grains whose c-axes are oriented at right angles to the film surface and a-axes (or b-axes) are oriented within a planar alignment angle of less than 35 degrees of a-axes (or b-axes) in the neighboring grains.

It is believed that this is a result of the action of the ions in the crystal aligning beam in removing unstable atoms which are oriented in non-aligned directions so that only those stable atoms which are oriented in the specified direction tend to remain on the substrate base. The result is a production of polycrystalline thin film of superior grain alignment. By controlling the deposition temperature at 300° C. or lower, effects of atomic mobility and lattice vibrations are reduced relative to the bombarding effects of the ion beams, so that a polycrystalline thin film of superior orientation control can be produced.

Therefore, by using such a substrate base for growing other functional thin films, devices having superior functional properties can be produced. In other words, if the functional film is a magnetic film, a magnetic thin film device of superior performance can be produced. If the functional film is an optical film, then an optical device of superior performance can be produced.

An example of a material which can be emitted by the target is yttrium-stabilized zirconia, and the product will be a highly oriented YSZ polycrystalline thin film.

Further, by limiting the thickness of the produced film to be not less than 200 nm, the grown thin film will have a sufficiently uniform orientation.

By forming a superconducting layer on the polycrystalline substrate base prepared according to the present method, a superconductor having an excellent consistency in grain orientation can be produced, thereby providing superior critical current density and superconducting properties.

An example of the polycrystalline substrate base which can be used is yttrium-stabilized zirconia. Also, by limiting the thickness of the polycrystalline base to be not less than 200 nm, a superconductor having superior performance properties will be formed on the substrate base of highly oriented polycrystal grains.

The present method is achieved by using an apparatus comprising: a deposition chamber for depositing a polycrystalline thin film on a substrate base and for housing following component devices; a feed spool for feeding a tape base in a longitudinal direction; a take-up spool for winding the tape base forwarded from the feed spool; a base holder disposed between the feed spool and the take-up spool for guiding the tape base while being in contact with a back surface of the tape base; a target disposed opposite to a front surface of the tape base being guided in the base holder for depositing particles emitted from the target; an ion source disposed opposite to the front surface for radiating an ion beam towards the front surface at an angle of incidence selected from a given range of angles; and a cooling device for cooling the substrate base through the base holder.

The apparatus is arranged so that it is possible to irradiate the particles being deposited on the substrate base in a tape form at an optimum angle, while the tape is being driven by a feed spool and conveyed over a base holder to be wound on the take-up spool. The depositing film can be kept at a suitable low temperature by cooling the base holder to promote the grain-aligning-effect of the ion beam irradiation, so that a polycrystalline thin film having superior crystal orientation can be produced.

In the apparatus, the cooling device is comprised by a hollow pedestal for attaching the base holder; and a cooling pipe attached to the pedestal and communicating an interior space of the pedestal with an exterior space by entering through an external wall of the deposition chamber.

Accordingly, because the cooling device can be operated independently of the low-pressure deposition chamber, the growing thin film can be cooled through the base holder so that the grain-aligning-effect of the ion beam irradiation can be applied more effectively to the depositing particles to produce polycrystalline thin film of superior orientation control, while controlling thermal vibrations and other adverse effects which disturb crystal orientation.

Furthermore, effective cooling of the growing thin film is obtained by providing inflow and outflow pipes to prevent stagnation of spent cooling liquid or gas.

In the apparatus, the cooling pipe has a double wall structure comprised by an inlet pipe for admitting a coolant by communicating with the interior space, and an outlet pipe surrounding the inlet pipe to communicate the interior space with the exterior space.

By providing a double-wall structure for the cooling device, the gas or liquid in the inflow pipe can be cooled by the liquid or gas being expelled from the base holder, thereby preventing a temperature rise in the inflow pipe so that effective cooling of the growing thin film can be maintained throughout the deposition process.

DESCRIPTION OF THE PREFERRED EMBODIMENTS

Preferred embodiments will be presented in the following with reference to the drawings.

Figure 1:
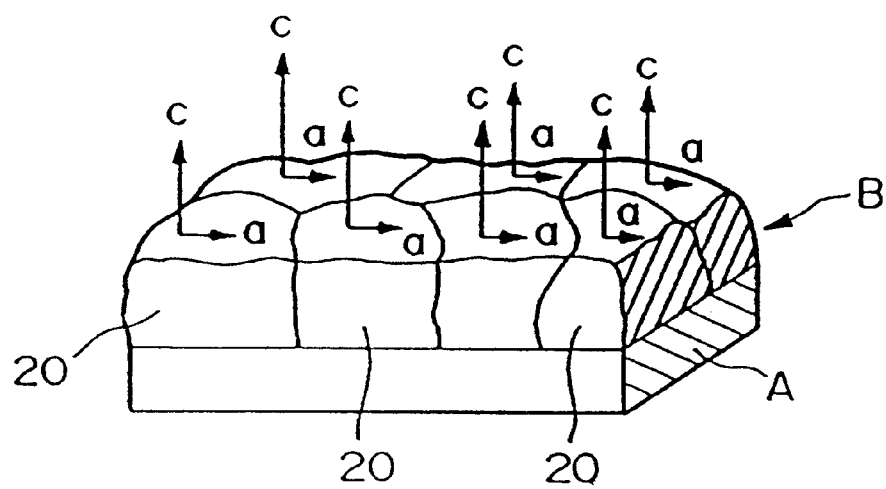
FIG. 1 is a cross sectional view of a YSZ polycrystalline thin film produced according to the present method.

FIG. 1 is a cross sectional view of an example of a structure of YSZ (yttrium-stabilized zirconia) polycrystal thin film B produced on a substrate base A in a tape-form, using the method of the present invention.

The substrate base A is a tape in this embodiment, but other substrate forms such as plates, wires and chords are applicable. The substrate base A may include metallic materials such as silver, platinum, stainless steel, copper, nickel alloys including Hastelloy, as well as various kinds of glasses and ceramic materials.

Figure 2:
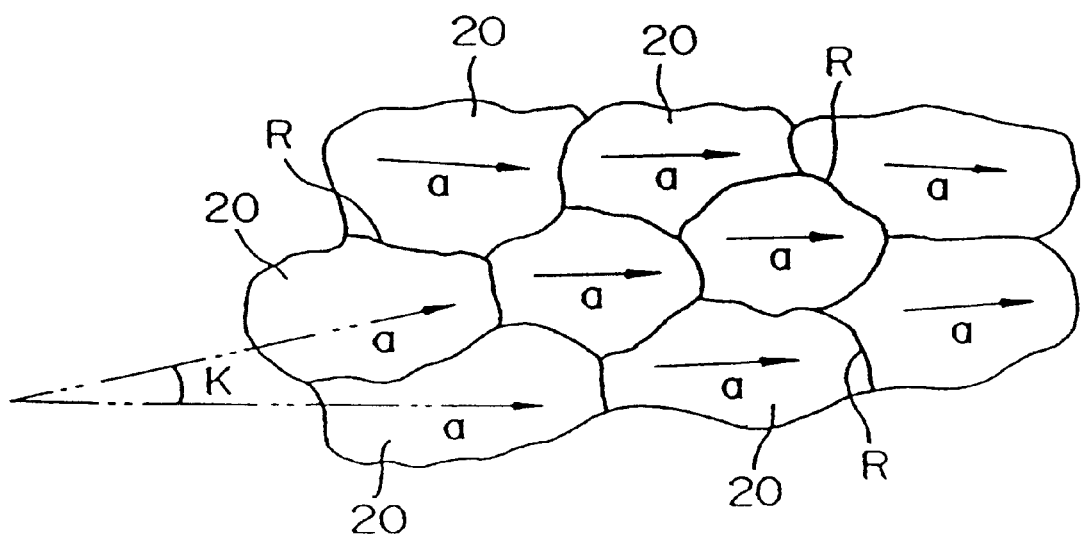
FIG. 2 is an enlarged plan view of the YSZ polycrystalline thin film of FIG. 1 showing the grains and the planar alignment angle in the grains.

The polycrystal film B is comprised by fine grains 20 of a cubic crystal group such as YSZ or $CeO_2$ separated by grain boundaries, and the c-axis in each grain 20 is oriented at right angles to the top surface (film surface) of the base A, and the a- and b-axes within each grain 20 are oriented in one direction in a horizontal plane. The a-axes (or b-axes) in one grain 20 and the a-axes (or b-axes) in its neighboring grain are oriented to each other at an angle of less than 35 degrees (planar alignment angle K shown in FIG. 2), which can be altered by varying the film deposition temperature during the deposition process, and the angle K can be controlled to be less than 35 degrees by suitably adjusting the deposition temperature.

Figure 3:
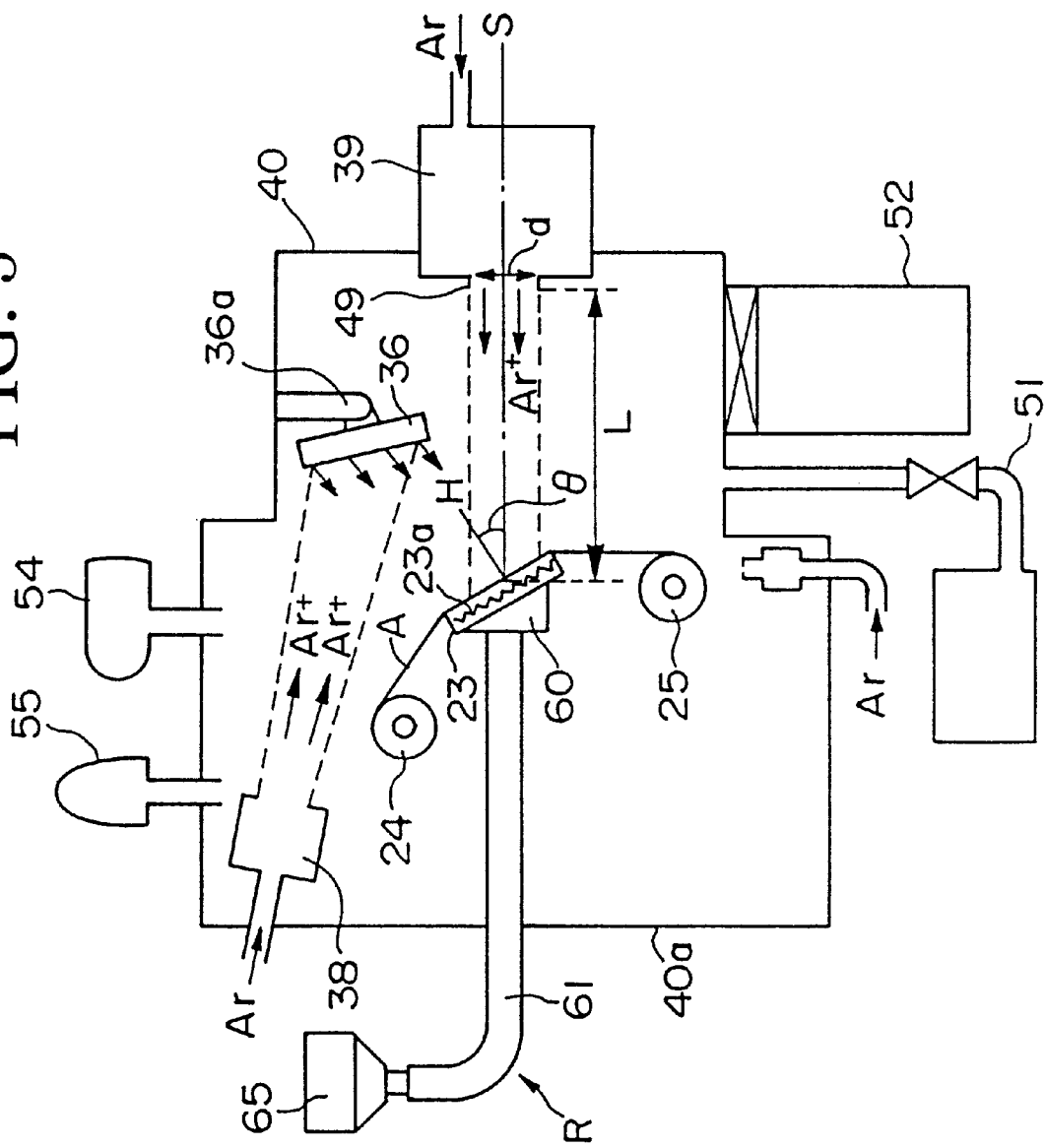
FIG. 3 is a schematic drawing of an apparatus for use in the present method.

FIG. 3 is an example of the thin film deposition apparatus suitable for use in the present method.

The apparatus is comprised by a vacuum chamber (deposition chamber) 40 encasing: a base holder 23 of a block shape for holding the base A in a tape form to heat or cool the base A to a desired temperature; a base feed spool (forwarding device) 24 for conveying the tape base A; a take-up spool (windup device) 25 for winding the tape base A; a plate-shaped target 36 disposed peripherally above and looking down at the base holder 23 at a slant angle; a sputter beam radiating device (sputtering means) 38 aiming down towards the target 36 at an inclined angle; an ion source 39 disposed laterally to face the target with a horizontal separation; and a cooling device R.

The base holder 23 has an internal resistance heater 23a comprised by metal resistance wires for heating the tape base A, which is being conveyed in contact with the base holder 23, to a desired temperature as required. The base holder 23 is placed in an optimum location of the deposition chamber 40 to receive an ion beam emitted from the ion source 39. The base holder 23 is attached to a pedestal 60, of a triangular shape in its side view, which is supported on a cooling pipe 61 of the cooling device R inserted through the external wall 40a into the deposition chamber 40. The cooling device R, comprised mainly by the pedestal 60 and the cooling pipe 61, is supported in the center section of the deposition chamber 40.

Figure 5:
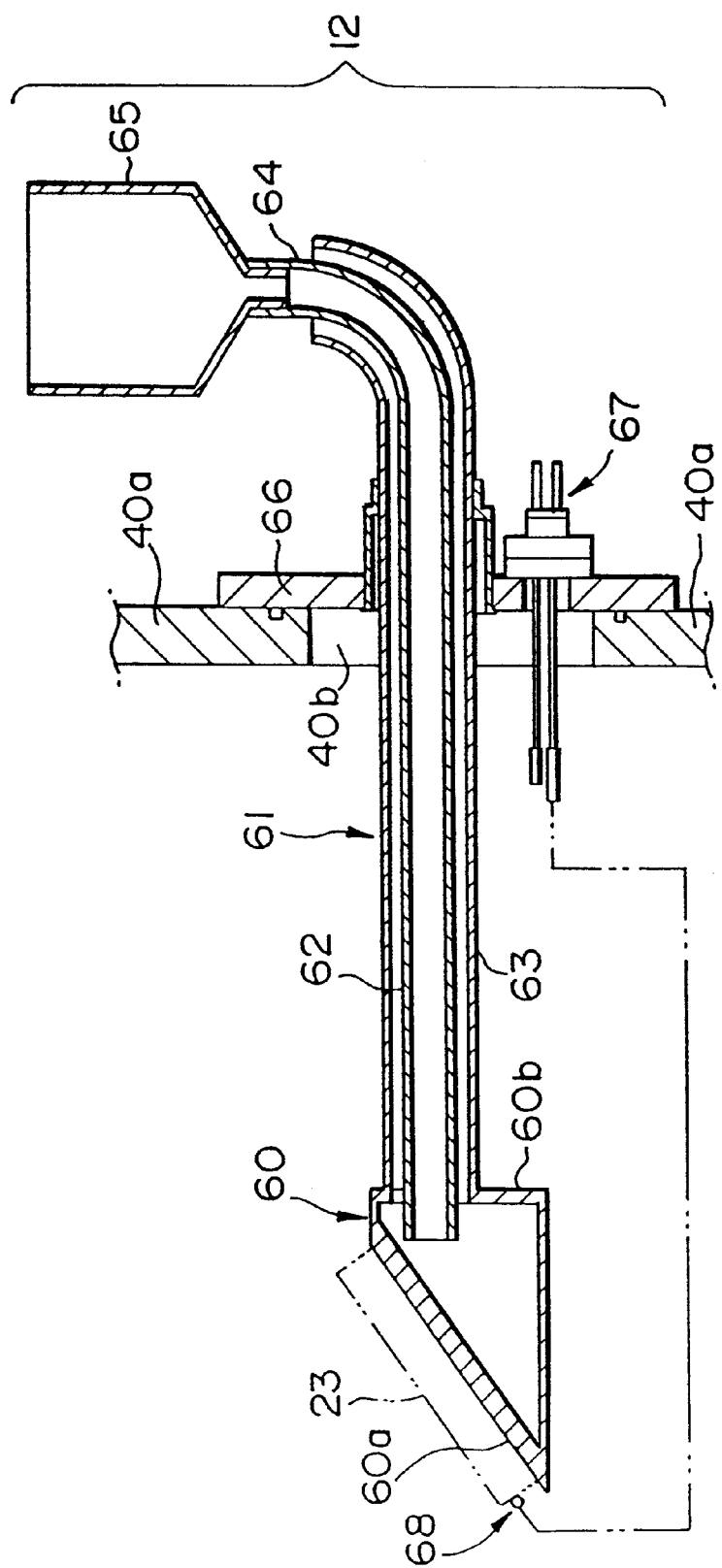
FIG. 5 is a cross sectional view of a cooling device for the apparatus shown in FIG. 3.

The pedestal 60 is a hollow metal block of a triangular appearance, as shown in FIG. 5, whose top surface 60a is inclined at an angle so as to provide a range of ion beam incident angles of 50~60 degrees with respect to base A. The back surface 60b of the pedestal 60 is attached to the cooling pipe 61, of a double wall construction having an inflow pipe 62 and an outflow pipe 63, both of which communicate with the hollow space of the pedestal 60. The inflow and outflow pipes 62, 63 are exited horizontally through the external wall 40a of the chamber 40 and then bent upwards so as to form a coolant supply section 65, where the inflow pipe 62 extends slightly beyond the outflow pipe 63 for attaching a funnel shaped coolant inlet section 64 to the start end of the inflow pipe 62.

Both inflow and outflow pipes 62, 63 are hermetically sealed to the back surface 60b of the pedestal 60, therefore, even when the chamber 40 is operated at a reduced pressure, the interior space of the pedestal 60 is maintained at an atmospheric pressure, so that a coolant such as liquid nitrogen or cooled air can be supplied through the cooling supply section 65 to fill the hollow space of the pedestal 60.

The reason for the double wall construction, comprised by inflow and outflow pipes 62, 63, is that if the cooling pipe has only an inflow pipe 62 and if liquid nitrogen is poured into the coolant supply section 65, stagnant vapor of liquid nitrogen vaporized in the hollow section of the pedestal 60 will block the entry of fresh liquid nitrogen into the hollow section. By providing the outflow pipe 63, any stagnant vapor and spent liquid nitrogen remaining in the hollow space can be purged to exterior space through the outflow pipe 63 so that the pedestal 60 can be cooled at all times with fresh liquid nitrogen to maintain the cooling capability of the pedestal 60. The double wall construction is further useful in keeping the inflow pipe 62 cool by the action of the vapor and spent liquid nitrogen flowing in the outflow pipe 63, thus preventing unwanted temperature rise in the interior of the inflow pipe 62.

The cooling pipe 61 is entered into the chamber 40 through a flange plate 66 attached to the external wall 40a with screws or other fasteners to close the feed-through hole 40b. The flange plate 66 is provided with a temperature measurement device 67, having a temperature sensor 68, adjacent to the cooling pipe 61 to enable the temperature of the base holder 23 to be determined. Specifically, the temperature of the base holder 23 can be determined by installing the base holder 23 on the top surface 60a of the pedestal 60 as illustrated by the double-dot line in FIG. 5, and letting the temperature sensor 68 to contact the base holder 23.

As explained above, the base material A can either be heated, as in FIG. 3, with a heater 23a to a temperature higher than room temperature or be cooled through the pedestal 60, as in FIG. 5, to attain any desired temperature in the base material A over a wide range of temperatures, for example, between 500° C. to −196° C. Electrical heating is sufficient to reach a temperature between room temperature and about 500° C. while liquid nitrogen cooling is sufficient to attain a temperature of 77 K (about −196° C.).

It is obvious that the cooling device R is not limited to the device shown in FIG. 5, and that other cooling devices, using a fluorine-group gases such as flurochlorohydrocarbons or ammonia, can be used to readily attain a temperature of about −30° C. Also, during the process of film formation at room temperature, the base material is heated by being bombarded with high temperature particles emitted from the target material, such that if the base holder is neither heated or cooled, the base is heated naturally to a temperature of about 100° C. When the base is being cooled with liquid nitrogen, the material and thickness of the base holder 23 can be varied suitably to adjust the cooling effect of the pedestal 60 on the substrate base A. For example, by choosing a thin, thermally conductive material for the base holder 23 and insuring that a proper amount of liquid nitrogen is being delivered, cooling by liquid nitrogen can achieve −150° C. even with a temperature rise in the base A during the deposition process due to natural heating. On the other hand, by choosing a thick metallic material for the base holder 23, the cooling capability of the pedestal 60 can be lowered so that the temperature of the base material will become higher. By such judicious choice of cooling conditions, temperature range of −150 to −50° C. can be readily attained.

Using the apparatus illustrated in FIG. 3, a continuous deposit of polycrystals on the tape base A can be produced by forwarding the tape base A continuously from the feed spool 24 over the base holder 23, and letting the tape material A pass through the optimum radiation section and picking up the tape material A on a take-up spool 25.

The target 36 is for producing the polycrystalline film of a required composition, and may be comprised by a material which is compositionally close or similar to the polycrystal material. Specifically, the target material may be chosen from MgO— or $Y_2O_3$— stabilized zirconia (YSZ), $CeO_2$, MgO, or $SrTiO_3$, but other materials which would be appropriate for the polycrystalline film may also be used. The target 36 is freely rotatably attached to a target holder 36a with a pin connection and the like, so that the inclination angle can be adjusted.

The sputter beam radiating device (sputtering means) 38 is comprised by a vapor source inside its container and a grid disposed near the vapor source for applying an extraction voltage to bombard the target 36 with ions so as to eject particles constituting the target material towards the base A.

The ion source 39 for generating a crystal aligning ion beam is constructed similarly to the sputter beam radiating device 38, and is comprised by a vapor source within a container and a grid disposed near the vapor source for applying an extraction voltage. A portion of the atom or molecules generated by the vapor source is ionized, and the ionized particles are accelerated towards the material A by the action of the electrical field of the grid. Methods of ionization include direct current arcing, high frequency induction, filament heating and cluster ion beam. Filament heating is based on impacting the vaporized particles with hot electrons produced by passing an electric current through a tungsten filament 47 in FIG. 4 in a high vacuum to produce ionized particles. Cluster ion beam method is based on impacting molecular clusters, effusing from the mouth of a crucible containing the target material into the vacuum environment, with hot electrons to produce ionized particles.

Figure 4:
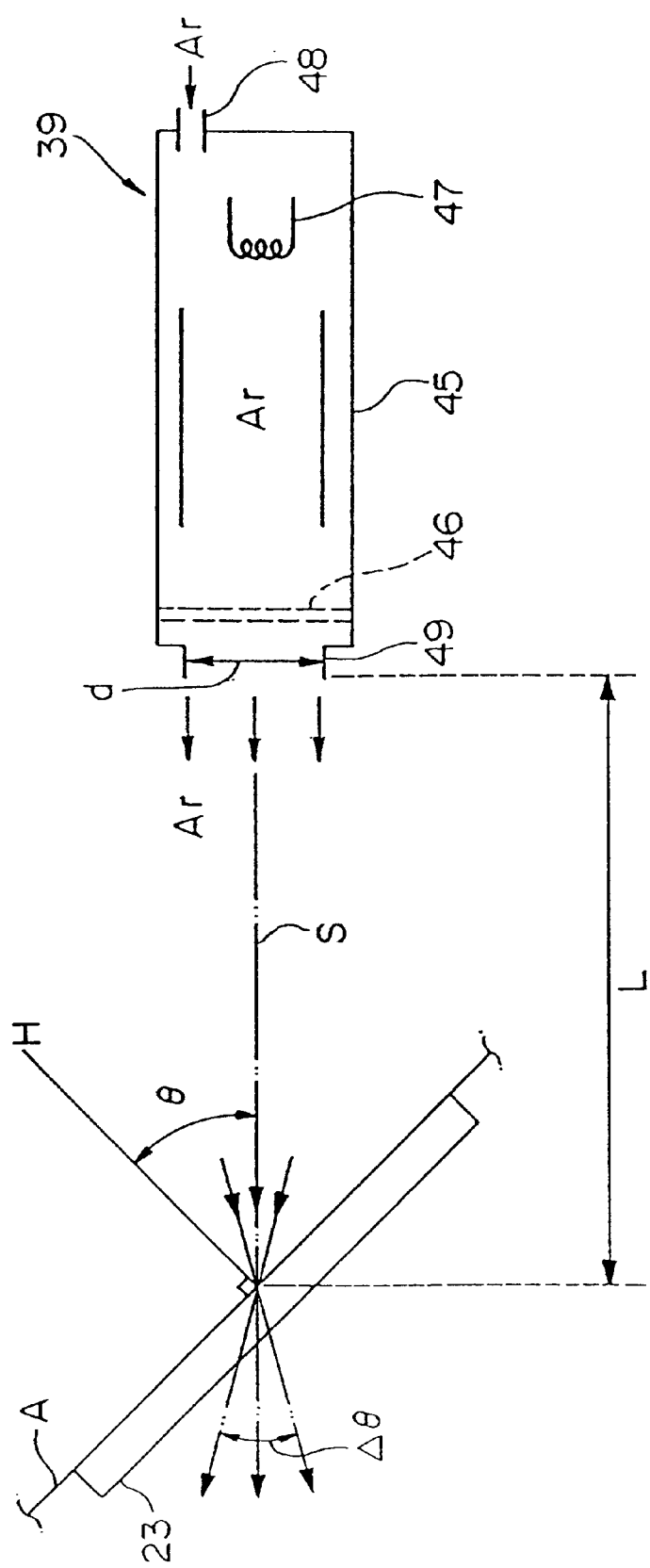
FIG. 4 is a cross sectional view of an ion gun in the apparatus shown in FIG. 3.

Polycrystalline film is produced in an apparatus in conjunction with the ion source 39 shown in FIG. 4. The ion source 39 is comprised by: a cylindrical ion chamber 45; a grid 46 disposed in the ion chamber 45; a filament 47 and a gas inlet pipe 48 for admitting gaseous substances such as argon into the chamber 45. Ion beam is emitted as a roughly parallel beam from a beam aperture 49 disposed at the exit end of the ion chamber 45. The beam aperture 49 can be adjusted to any diameter d and the location of the ion source 39 can be changed.

The ion source 39 is disposed to oppose the tape base A so that its center line S makes an angle of incidence θ (defined as an angle between the normal to the base A and the center line S) as illustrated in FIG. 3. It is preferable that this incidence angle θ is in a range of 50–60 degrees, more preferably 55–60 degrees and most preferably 55 degrees. The ion source 39 is thus positioned so as to enable to irradiate the base A with the crystal aligning ion beam at a certain selected incidence angle θ.

The angle of spread of the crystal aligning ion beam leaving the ion source 39 is given by the following equation:

$$\Delta\theta \leq 2\tan^{-1}(d/2L) \quad (1)$$

where, Δθ is the spreading angle of the ion beam; d is the beam diameter in cm of the ion source 39; L is a distance in cm between the beam aperture 49 of the beam source 39 and the base A which corresponds to an ion flight distance. The ion flight distance L and the beam aperture d are selected to suit the desired orientation properties of the polycrystals to be grown. It is preferable that the beam spread angle Δθ is in a range of less than 5 degrees and more preferably less than 3 degrees. For example, if L=40 cm, and if the aperture is set at d≦3.49, then it is possible to control the spread angle at Δθ≦5 degrees, and if the aperture is set at d≦2.09, then the spread angle is controlled at Δθ≦3 degrees.

The crystal aligning ion beam produced by the ion source 39 may include rare gas ions such as $He^+$, $Ne^+$, $Ar^+$, $Xe^+$ and $K^+$ or any such ion beam mixed with oxygen ions when making an intermediate layer of YSZ; but a $Kr^+$ beam or a mixed ion beam of $Kr^+$ and $Xe^+$ are used especially when making an intermediate layer of $CeO_2$.

The deposition chamber 40 includes external devices including rotary pump 51 for evacuating the chamber 40 to a low pressure, a cryo-pump 52 and an ambient gas source such as gas bottles for supplying an ambient gas, so as to maintain the atmosphere inside the chamber 45 to be in a low pressure gaseous environment, containing an inert atmosphere comprised by argon gas or other inert gas or by an inert gas atmosphere containing some oxygen.

The deposition chamber 40 has a current density measuring device 54 to measure the ion beam current density and a pressure gage 55 to measure the pressure within the chamber 40.

Any type of angle adjusting device may be used on the support section of the ion source 39 for adjusting its orientation angle so as to enable to vary the angle of incidence of the ion beam. Also, the ion flight distance L is varied by moving the position of the ion source 39, however, the same result can be obtained by arranging the length of a support member 23b (NOTE: 23a IS A HEATER) for the base support 23 to be adjustable to alter the distance L.

Next, a method of making a YSZ polycrystal thin film on a tape base A in the apparatus of the present invention will be described.

To produce a polycrystal thin film on the tape base A, a target 36 of YSZ or $CeO_2$ is selected, and the deposition chamber 40 is evacuated to a reduced pressure and the tape base A is conveyed at a certain speed from the feed spool 24 over the base holder 23 while activating the ion source 39 and sputter beam radiating device 38.

The temperature of the base A in contact with the base holder 23 is adjusted to a temperature below 300° C. by operating either the internal heater 23a of the base holder 23 or the cooling device. Based on the results (to be shown later) of the critical current density data in the superconductor layer, it is preferable to set the base temperature to be at the lowest possible temperature up to 300° C. When choosing a base temperature below 300° C., if the base holder 23 is held at room temperature without auxiliary heating, it is preferable that the desired base temperature be less than 100° C., and if a low-cost liquid nitrogen is used, the desired temperature should be higher than −150° C.

Here, it should be noted that, if liquid nitrogen is used as a coolant, the lowest limiting temperature of the base A achievable (by feeding liquid nitrogen through the inlet section 65 and inlet pipe 62 to reach the pedestal 60) is about −150° C. even with the use of a thin base holder. This is because of the thermal balance prevailing in the depositing polycrystal layer including the effects of the radiative heating by other devices within the chamber 40. It is necessary to use some other coolant such as liquid helium, if a temperature lower than −150° C. is required.

When the sputtering beam is bombarded on the target 36, constituent particles of the target 36 are ejected out and fly over to deposit on the base A. While the particles ejected from the target 36 are being deposited on the base A held on the base holder 23, a crystal aligning ion beam of mixed ions, comprised by argon ions $Ar^+$ generated from the ion source 39 and oxygen ions, is radiated on the base A to deposit a polycrystalline thin film B of a desired thickness on the tape base A. The deposited tape with a polycrystal layer is picked up by the take-up spool 25.

The incidence angle θ of the crystal aligning ion beam is preferably in a range of 50~60 degrees and more preferably between 55~60 and most preferably 55 degrees. It is not desirable to select 90 degrees for the angle θ, because, although the c-axis in the grains can be oriented at right angles to the film surface, the surface of the base will be dominated by (111) planes. If θ becomes 30 degrees, even the c-axes in the grains cannot be aligned at right angles to the base surface. Therefore, it is necessary to irradiate the crystal aligning ion beam within the range of angles of incidence specified above to obtain a thin film having (100) surface oriented parallel to the crystal surface. When the sputtering process is carried out accompanied by the crystal aligning ion beam irradiation as described above, both the a- and b-axes of the grains formed on the base A become aligned in one direction along the top surface (film surface) of the deposited polycrystalline film.

According to the present method of making a polycrystal thin film, the particles constituting the target 36 are sputtered out from the target 36 to be deposited on the base A disposed in an evacuated deposition chamber 40, and concurrently with the sputtering process, a crystal aligning ion beam generated from an ion source 39 is radiated on the depositing crystals at an angle of incidence between 50~60 degrees for the purpose of aligning the crystal axes in the grains. Grains having highly developed orientation alignment can be produced by adjusting the temperature of the base A during the deposition process. The adjustment of the incidence angle can be performed by preparing several pedestals 60 having different inclination angles of the top surface 60a so that an appropriate type of pedestal to suit the application can be employed.

As will be demonstrated later in Examples, the planar alignment angle of 35 degrees in YSZ is produced at a base temperature of 300° C.; the angle of 25 degrees at 200° C.; the angle of 18 degrees at 100° C.; the angle of 13 degrees at 0° C.; the angle of 10 degrees at −100° C.; and the angle of 8 degrees at −150° C.

Figure 6:
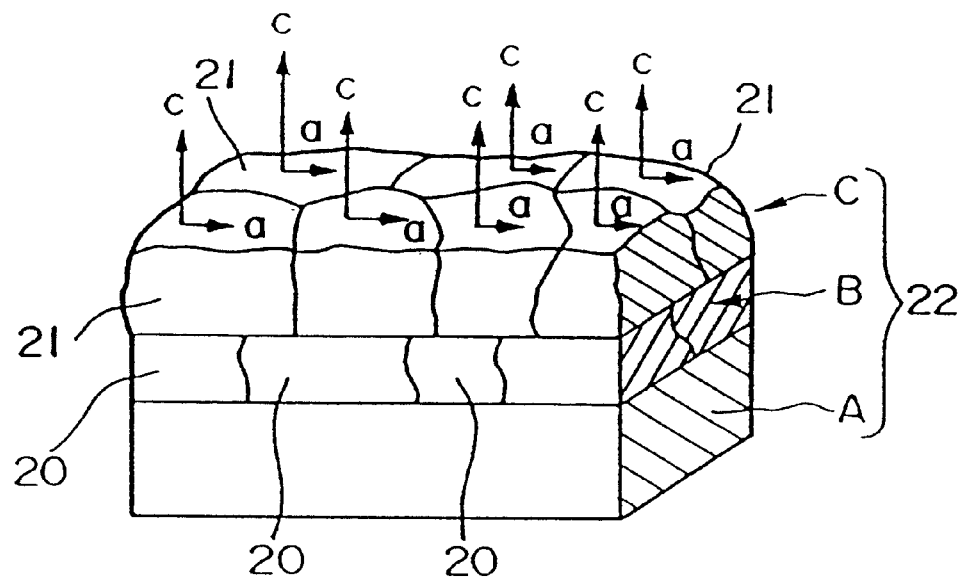
FIG. 6 is a cross sectional view of an oxide superconductor layer formed on top of the YSZ polycrystalline layer shown in FIG. 1.

By depositing an oxide superconductor layer C on the polycrystal thin film layer B thus produced, a structure of an oxide superconductor 22 shown in FIG. 6 can be produced. The oxide superconductor layer C is deposited over the grains 20 in the polycrystalline thin film B, and the c-axes of the grains 21 (23 IS BASE HOLDER) are oriented at right angles to the top surface of the thin film B and the a- and b-axes of the grains 21 are oriented within a plane parallel to the top surface of the base A, with a small planar alignment angle K between the grains 21.

The oxide superconducting material for the superconducting layer may include oxide superconductors of a high critical current density represented typically by formulae such as, $Y_1Ba_2Cu_3O_{7-x}$, $Y_2Ba_4Cu_8O_y$, $Y_3Ba_3Cu_6O_y$, or by formulae such as, $(Bi, Pb)_2Ca_2Sr_2Cu_3O_y$, $(Bi, Pb)_2Ca_2Sr_3Cu_4O_y$, or $Tl_2Ba_2Ca_2Cu_3O_y$, $Tl_1Ba_2Ca_2Cu_3O_y$ and $Tl_1Ba_2Ca_3Cu_4O_y$.

When the oxide superconducting layer C is deposited, by sputtering or laser-assisted vapor deposition method, on top of a polycrystalline layer of precisely aligned grains having a planar alignment angle K in a range of 8~35 degrees, then the layer C can also grow as an epitaxial layer by following the precise orientation preference of the underlayer.

Such an oxide superconducting layer C produced on the polycrystalline layer B has very little randomness in orientation, and within each grain in layer C, the c-axes which exhibit inferior electrical conductivity are oriented in the thickness direction of the layer C, and the a- and b-axes, which exhibit good electrical conductivity, are oriented in the longitudinal direction of the base A. The superconducting layer C thus produced exhibits excellent quantum coupling at the grain boundaries, thereby almost eliminating degradation in superconducting properties at the grain boundaries to promote the flow of current in the longitudinal direction of the base A. The result is that the critical current density can be almost as high as those in superconductors formed on a single crystal base of MgO or $SrTiO_3$.

It was observed that at a base temperature of 300° C., a YSZ polycrystalline film having a planar alignment angle of 35 degrees was obtained to give a critical current density of 55,000 A/cm$^2$ in the superconducting layer; at 200° C., corresponding values were with 25 degrees and 180,000 A/cm$^2$; and at 100° C., the values were 18 degrees and 550,000 A/Cm$^2$. At lower temperatures, the following results were obtained: at 0° C. base temperature, the film showed a planar alignment angle of 13 degrees and a critical current density of 800,000 A/cm$^2$; at −100° C., the corresponding values were 10 degrees and 1,300,000 A/cm$^2$; and at −150° C., the values were 8 degrees and 2,500,000 A/cm$^2$.

It has thus been demonstrated that it is possible to form an oxide superconductor 22, having highly aligned grains and superior critical current density, on a substrate base of a polycrystalline YSZ thin film B by maintaining the base temperature at a suitable processing temperature below 300° C. and irradiating the base with a crystal aligning ion beam during the deposition process.

The superconductor obtained by the method outlined above is mechanically flexible because of its longitudinally extending shape of the tape, and it is expected that such a material would be useful as a winding in superconducting magnets.

The factors that are responsible for providing superior grain orientation in polycrystalline thin film B are thought to be the following.

The unit cell of the polycrystalline YSZ thin film B is cubic, and in such a crystal lattice, the normal to the base is a <100> direction, and the <010> and <001> directions are oriented in the planar directions. Considering a case of an ion beam being radiated onto such a structure at an inclined angle to the normal, if the beam is injected along the <111> direction, the angle of incidence with respect to the normal is 54.7 degrees.

According to the technique disclosed in an earlier patent application (said JPA, First Publication No. H6-145977 etc.) by the present inventors, the relationship between the ion beam incidence angle and the full-width at half-measure (FWHM, an indicator of the scatter in crystal orientations) of the X-ray peak intensities showed a minimum between 50 to 60 degrees.

Minimizing of the orientation scatter observed in the film B when the incidence angle is between 50~60 degrees is thought to be caused by the maximizing effect of the ion channeling phenomenon when the ion beam is radiated at an angle of 54.7 degrees. When the ions are injected at an incidence angle centered about the optimum 54.7 degrees towards the particles being deposited on the base A, only those atoms which are in good alignment with the optimum incidence angle are able to remain on the base A while other atoms of irregular alignment are removed from the base A because of the sputtering action of the crystal aligning ion beam. The result is a production of a highly aligned structure retained selectively on the base A.

It should also be noted that there are two effects of the ion irradiation action on a YSZ base; one effect is to promote the growth of (100) planes and the other effect is to align the planar directions of the growing crystals within the grains. The present inventors believe that the effect of erecting (100) planes precisely at right angles on the base surface plays a dominating role, because, if the basic requirement of erecting (100) planes is not satisfied, planar orientations will be disturbed inevitably.

Next, the reasons that are thought to be responsible for improving the planar alignment angle K when the base temperature is controlled during the deposition process with ion irradiation at an angle of 50~60 degrees (i.e. improvement in the grain alignment in the polycrystalline thin film B) will be discussed in the following.

It is commonly recognized, in normal film forming methods of sputtering and laser-assisted vapor deposition, that better crystallinity is obtained by depositing the crystals in a high temperature environment, for example 400~600° C. or higher. This is indicative of the fact that there is a close connection between the deposition temperature and the crystallinity, and it is generally understood, in the thin film deposition field, that low deposition temperatures tend to promote the growth of amorphous films.

However, according to the present method of producing thin films with ion beam irradiation, it has been found, conversely, that lower deposition temperatures are preferable, because of the predominating effect of the crystal aligning ion beam. This is believed to be a result of the fact that at lower deposition temperatures, atomic mobility and lattice vibrations are correspondingly lowered, so that the crystal aligning effect of the ion beam becomes comparatively more effective in producing a superior grain alignment in the polycrystalline thin film.

In other words, using the method of the present invention, the lower the deposition temperature the more clearly defined are the [100] axes in the polycrystalline thin film. It follows that [111] axes in the thin film can also be determined uniquely and also that dechanneeling effects caused by thermal lattice vibrations of the atoms become less at lower deposition temperatures, thereby decreasing the collision cross sectional area for ions impacting on the crystals along the [111] axes and improving the control over the crystal orientation, thereby improving the grain alignment in the deposited film.

It should be noted that the observations made in the present invention (that the lower the base temperature the better the grain alignment in the film B, and that superior grain alignment is achieved when the polycrystalline thin film B is formed below 100° C.) are contrary to the generally held belief in the conventional crystal growth technologies that high deposition temperatures are required for achieving superior crystallinity. This contradiction is an effective demonstration of the uniqueness of the approach of radiating the ion beam at an inclined angle to the base for grain aligning purposes.

EXPERIMENTAL EXAMPLES

Example 1

Sputter deposition with ion-beam irradiation was conducted using the apparatus shown in FIGS. 3~5 to produce YSZ polycrystals on a metal tape. The apparatus shown in FIG. 3 was placed in a vacuum chamber and evacuated to a pressure of $3.0 \times 10^{-4}$ torr, and a gaseous mixture of $Ar+O_2$ was supplied to the chamber at a rate of 16.0 sccm (standard cubic centimeters per minute) for argon and at a rate of 8.0 sccm for oxygen.

The base material was Hastelloy C276 of a mirror-polished front face made into a tape form of 10 mm width and 0.5 mm thickness and several meters in length. The target material was YSZ (containing 8 mol % of $Y_2O_3$) and the sputtering process was carried out by bombarding the target with $Ar^+$ ions while concurrently performing the crystal aligning process using the $Kr^+$ ions emitted from an ion gun positioned to generate an angle of incidence of 55 degrees to the normal to the surface of the tape base, and bombarding with an ion beam energy of 300 eV, for $Kr^+$ and $O_2$ ions, and ion current density of 100 $\mu A/cm^2$. The deposition process was assisted by directing a laser beam onto the tape base which was conveyed at a given speed over the base holder to produce a YSZ film of 1100 nm thickness on the tape base.

The base temperature was controlled by using the resistance heater provided in the base holder to attain a base temperature of 500, 400, 300 and 200° C. When deposition was carried out at room temperature, without the use of the heater, the temperature of the base and the deposited crystals were maintained at about 100° C. due to the effect of ion beam irradiation and heat transferred from other parts of the apparatus. For comparison purposes, cooling was performed using liquid nitrogen in the cooling device shown in FIG. 5, and utilizing a different thickness of the base holder so as to attain a substrate temperature of 0, −100 and −150° C.

Figure 18:
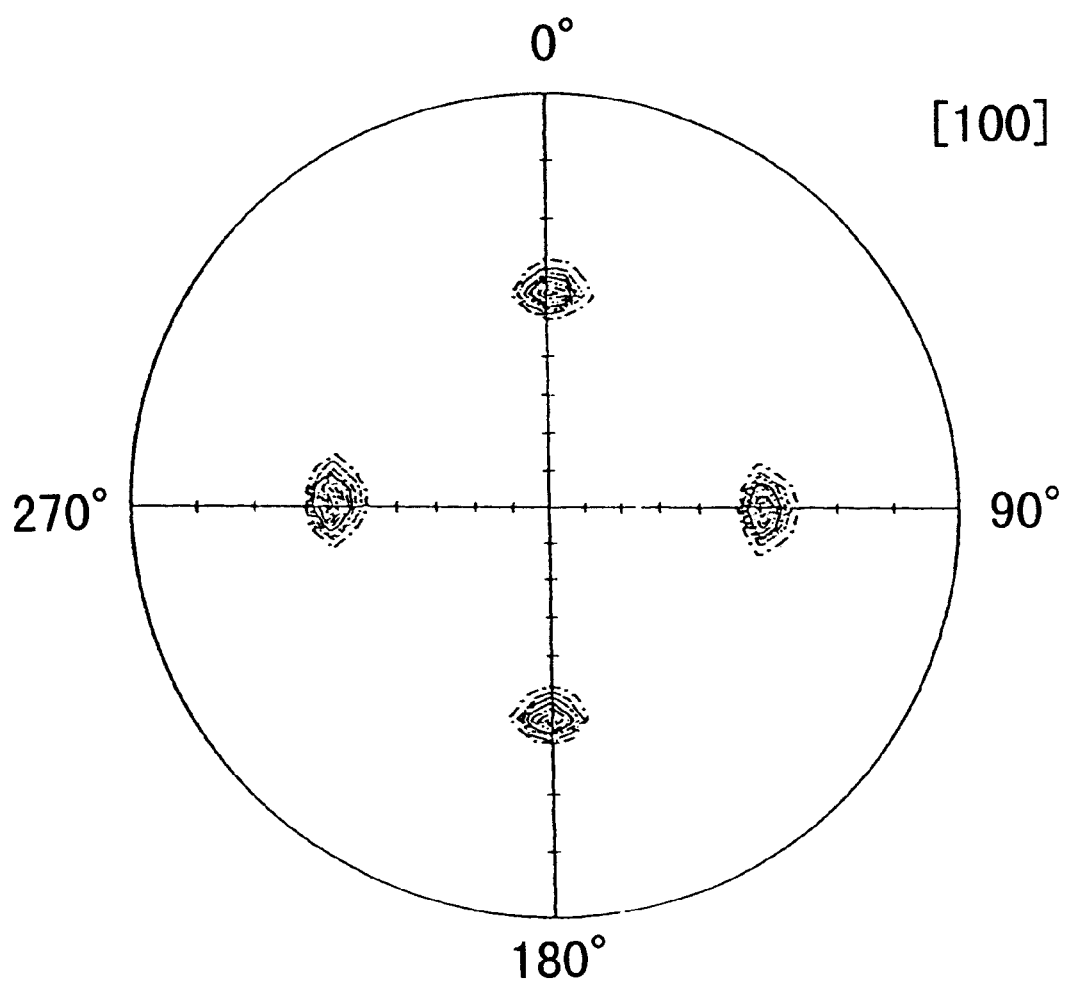
FIG. 18 is a pole figure diagram of a polycrystal produced at 0° C. with an ion beam incidence angle of 55 degrees and ion beam energy of 300 eV.

X-ray pole figure diagrams for (111) and (100) planes in the samples produced under different conditions are shown in FIGS. 8–12 and in FIG. 18. From these results, it can be observed that the deposition temperatures lower than 300° C. produced superior alignment of grains of the [100] orientation (refer to FIG. 8). Conversely, when the deposition temperature was increased beyond 300° C. (400 or 500° C.), it was found that the grain orientation was not in the [100] orientation but tended to approach the [111] orientation (refer to FIGS. 11 and 12). It is clear from observations of the pole figure diagrams that even within a range of deposition temperatures below 300° C., the lower the deposition temperature the more superior the grain alignment effect.

For each of the samples having proper c-axis orientation, investigations were carried out to determine whether both the a- and b-axes are oriented properly within the planes of the YSZ thin film.

Figure 7:
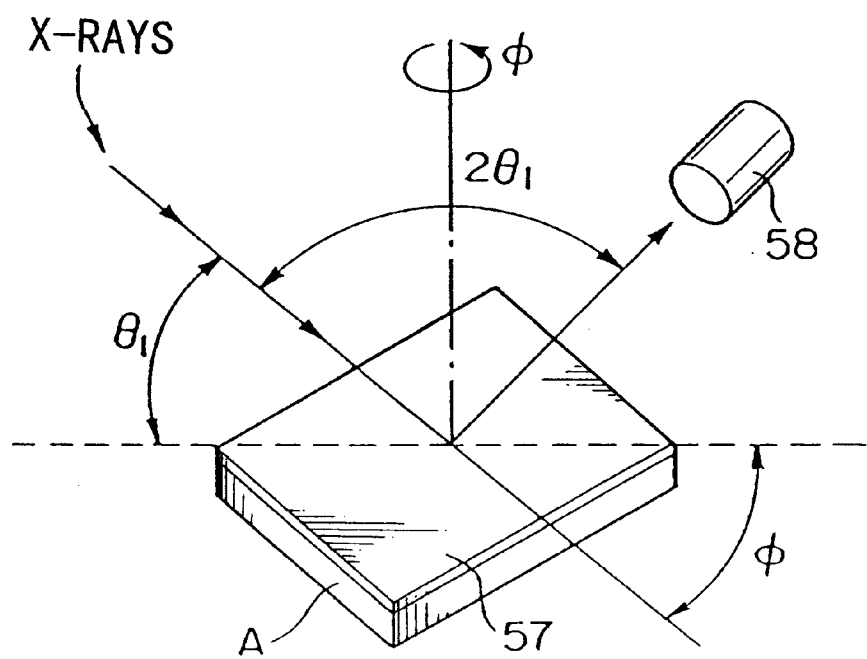
FIG. 7 is a schematic drawing of an X-ray device for determining the crystal orientation of a polycrystalline thin film.
Figure 8:
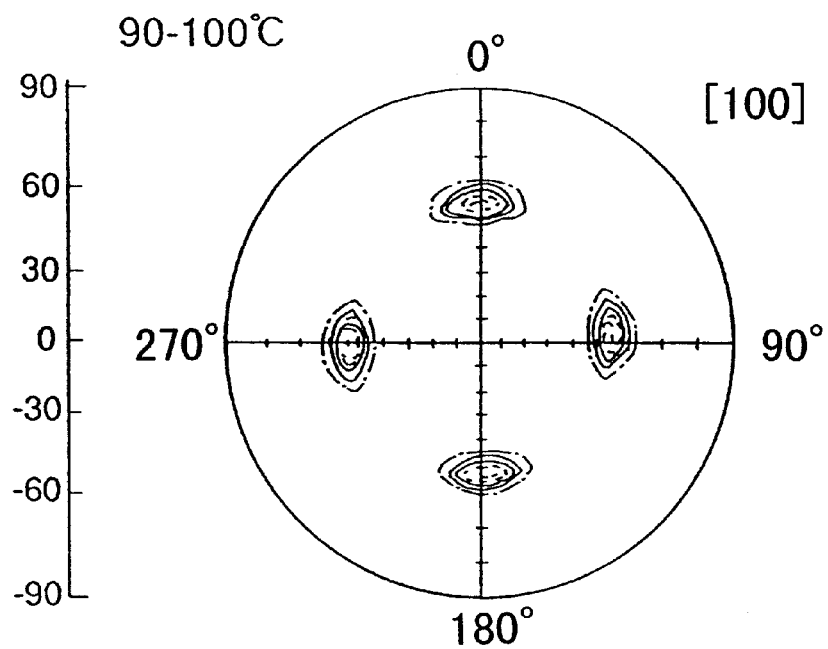
FIG. 8 is a pole figure diagram of a polycrystal produced at 100° C. with an ion beam incidence angle of 55 degrees and ion beam energy of 300 eV.
Figure 9:
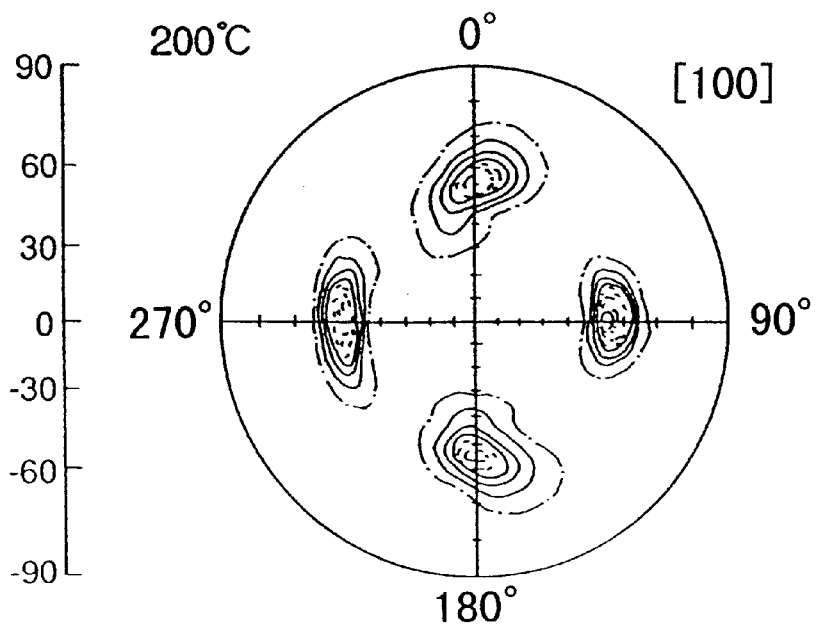
FIG. 9 is a pole figure diagram of a polycrystal produced at 200° C. with an ion beam incidence angle of 55 degrees and ion beam energy of 300 eV.
Figure 10:
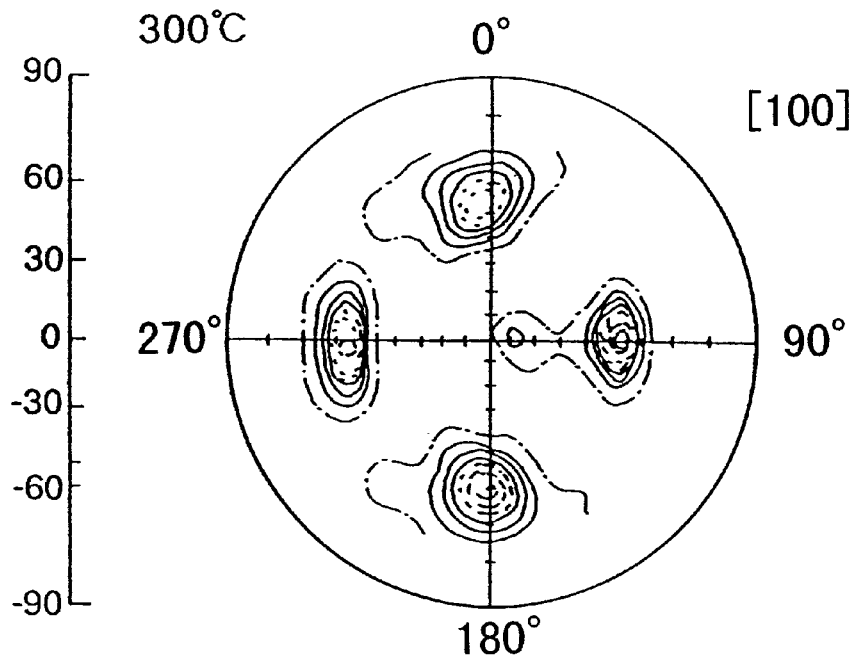
FIG. 10 is a pole figure diagram of a polycrystal produced at 300° C. with an ion beam incidence angle of 55 degrees and ion beam energy of 300 eV.
Figure 11:
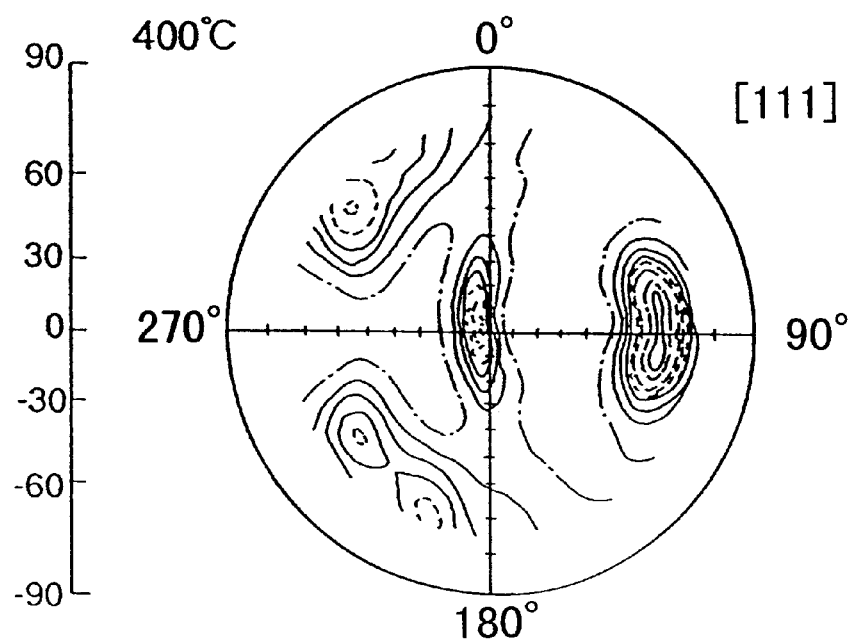
FIG. 11 is a pole figure diagram of a polycrystal produced at 400° C. with an ion beam incidence angle of 55 degrees and ion beam energy of 300 eV.
Figure 12:
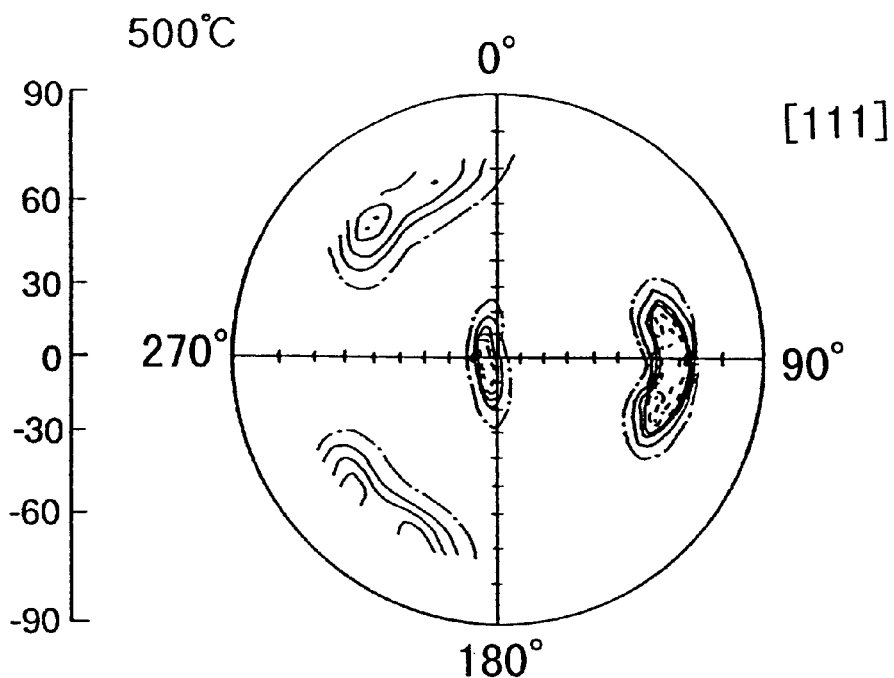
FIG. 12 is a pole figure diagram of a polycrystal produced at 500° C. with an ion beam incidence angle of 55 degrees and ion beam energy of 300 eV.

These measurements were performed by directing an x-ray beam towards the YSZ polycrystalline thin film at an angle $\theta_1$, as illustrated in FIG. 7, and positioning an x-ray counter 58 at $2\theta_1$ (58.7 degrees) in a vertical plane containing the incident x-ray beam, and rotating the base A through a suitable angle in a plane horizontal to the vertical plane containing the incident x-ray beam (i.e., rotating through a horizontal angle $\phi$ in the direction of the arrow in FIG. 7) to measure the diffracted intensities. This process was used to determine the planar alignment angle K between the a-axes themselves or the b-axes themselves in the neighboring grains of the polycrystalline thin film B.

Further, the orientations of the various grains of the YSZ thin film B were studied. To perform these tests, the measuring process described above was refined in such a way tha the angle $\phi$ was moved in steps of one degree from −20 to +20 degrees, to determine the diffraction peaks at each one degree setting. By noting the range of ✔ degrees of appearance and disappearance of the diffraction peaks, it was possible to determine a detailed description of the distributions of grain orientations in the plane of the thin film B. In other words, the probability of grains oriented in a specific direction within a given planar alignment angle K Proceeding further to the second stage of the method, oxide superconducting layer was deposited by sputtering target particles on the polycrystalline thin film produced above. The target material had a nominal composition of $Y_{0.7}Ba_{1.7}Cu_{3.0}O_{7-x}$. Sputtering was performed in the processing chamber evacuated to a pressure of $1\times10^{-6}$ torr. The deposit was the subjected to an oxidation heat treatment by heating the tape base at 400° C. for 60 minutes. The superconducting tape thus produced measured 10 mm in width and 1 meter in The superconducting tape was cooled in liquid nitrogen, and the critical temperature and critical current densities were determined by the four-probe method.

The results of probe measurements are reported below.

| Deposition temp, ° C. | Planar grain orientation | Critical current density $(A/cm^2)$ |
|---|---|---|
| 500 | [111] orientation | 12,000 |
| 400 | [111] orientation | 11,000 |
| 300 | 35 ° | 55,000 |
| 200 | 25 ° | 180,000 |
| 100 | 18 ° | 550,000 |
| 0 | 13 ° | 800,000 |
| −100 | 10 ° | 1,300,000 |
| −150 | 8 ° | 2,500,000 |

From these results, it can be seen that, at a deposition temperature higher than 400° C., the grains become oriented in the [111] direction, and consequently, high values of critical current density are not obtainable. When the deposition temperature is lower than 300° C., the grain alignment improves and critical current density is also improved. This tendency becomes more pronounced as the deposition temperature is lowered, and the results demonstrate that: it is preferable to operate at less than 200° C. deposition temperature to obtain critical current density values in excess of 180,000 $A/cm^2$, an to operate at less than 100° C. deposition temperature to obtain the same in excess of 550,000 $A/cm^2$. From these results, it can be concluded that it is preferable to operate in the range of deposition temperatures of 300° C. to −150° C. and even more preferably in the range of 100° C. to −150° C.

Figure 13:
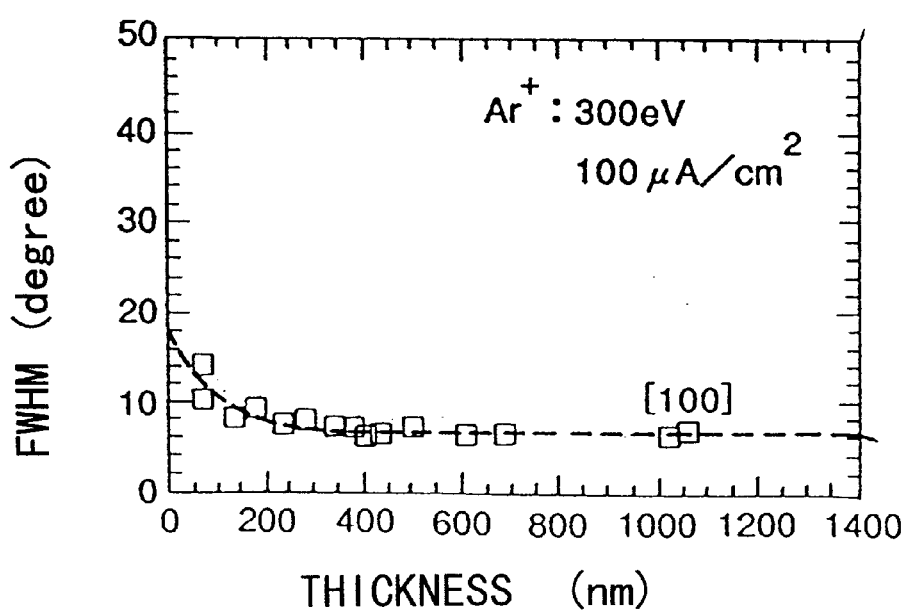
FIG. 13 is a graph showing a relationship between the thickness of the thin films and the full-width at half-measure of the diffraction peaks in degrees.
Figure 14:
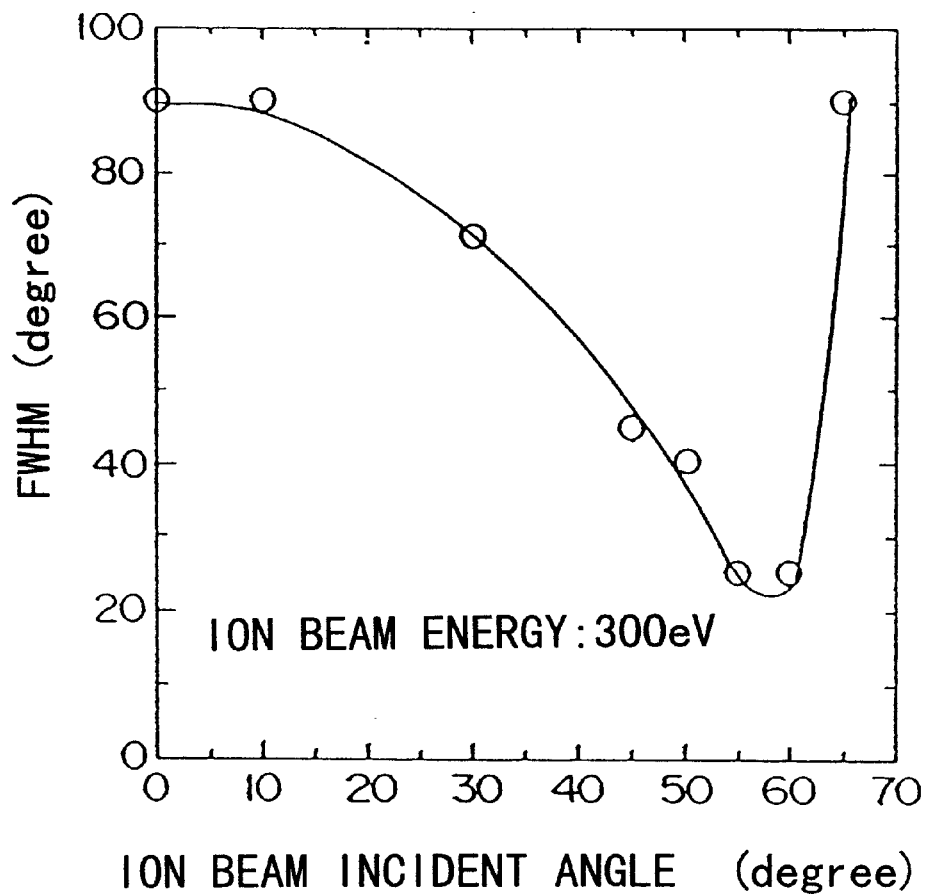
FIG. 14 is a graph showing a relationship between the ion beam incidence angle and the full-width at half-measure of the diffraction peaks in degrees.
Figure 15:
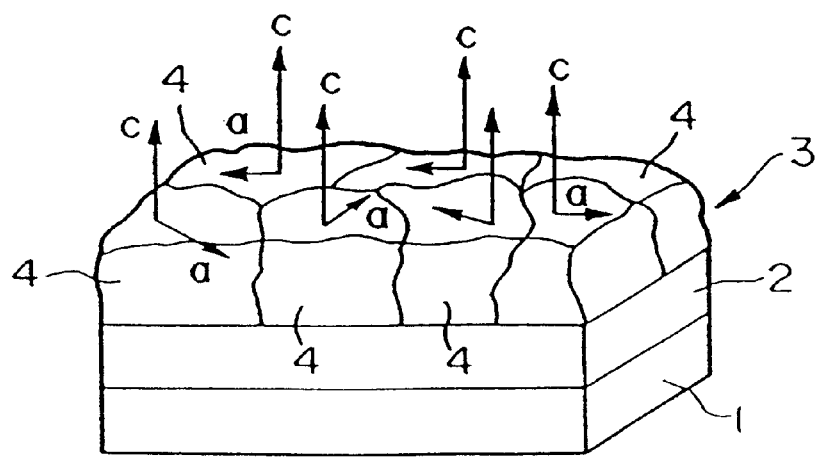
FIG. 15 is a schematic drawing of an oxide superconductor layer produced on a polycrystalline thin film layer by a conventional method.

Next, FIG. 13 shows the dependency of the gain orientation scatter as measured by the full-width at half-measure (FWHM) on the thickness of the polycrystals formed on the tape base for the deposition temperature at 100° C.

According to these results, it can be seen that the [100] orientation becomes more well-defined starting at a film thickness in excess of 200 nm. These results suggest that, when growing polycrystals with ion beam incident at 50–60 degrees, the degree of grain alignment improves as the film thickness increases, even though the grain orientation may be random in the initial stages of deposition. Judging from the tendency of the [100] axes to begin aligning when the film thickness exceeds 200 nm, it is clear that superior alignment of crystals can be produced as the film grows thicker.

Figure 16:
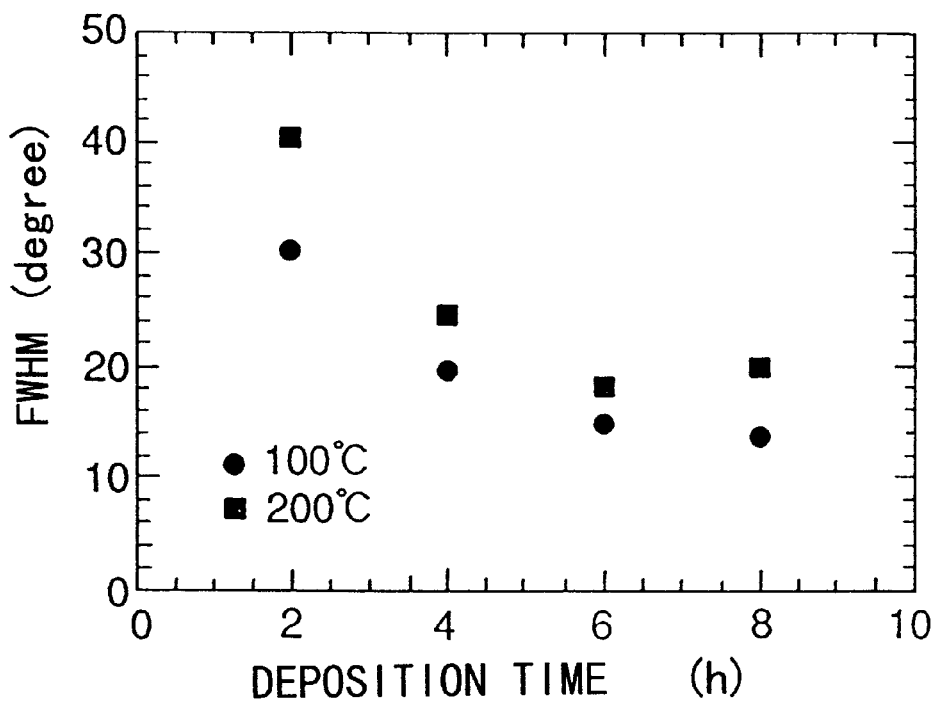
FIG. 16 is a graph showing a relationship between the duration of the vapor deposition process and the full-width at half-measure in degrees of diffraction peaks of the polycrystals produced by the present method.
Figure 17:
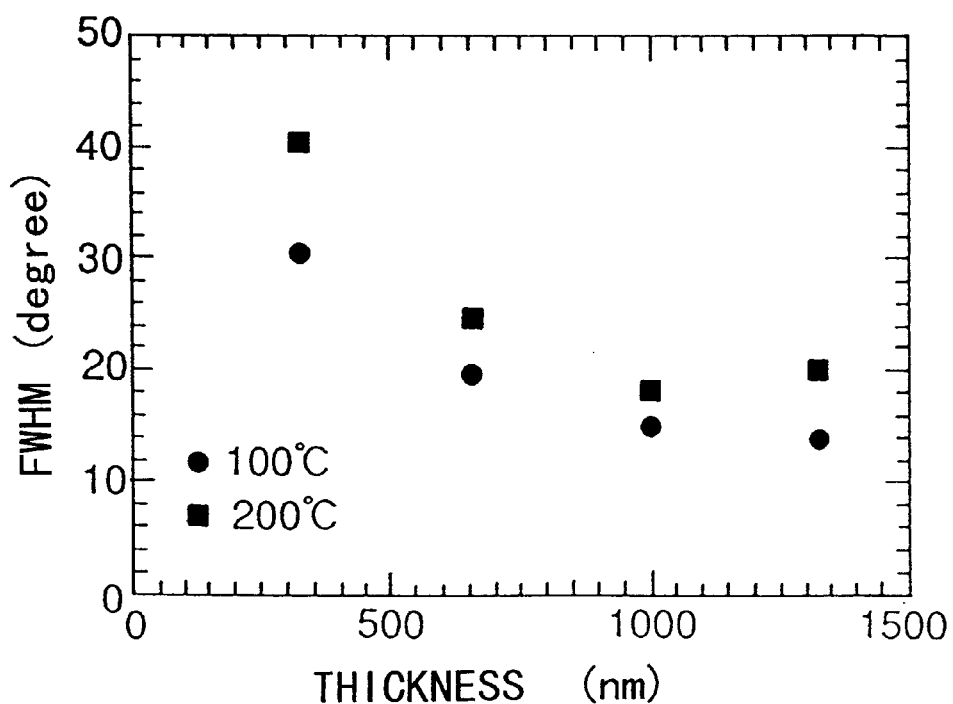
FIG. 17 is a graph showing a relationship between the film thickness and the full-width at half-measure in degrees of the diffraction peaks of the polycrystals produced by the present method.

Next, FIG. 16 shows the dependency of FWHM on the duration of deposition process, and compares the results of deposition performed at 100 and 200° C. and FIG. 17 compares the dependency of FWHM on film thickness, and compares the results of deposition performed at 100 and 200° C.

In both cases, the results confirm that the grain alignment is better for the lower deposition temperature of 100° C.

The results also confirm the observation that certain minimum deposition duration is required, in other words, a minimum film thickness is required to achieve some degree of grain alignment.

It should be noted that foregoing embodiments are meant to be illustrative and not restrictive. Many variations in the actual approach to the method and apparatus can be developed within the demonstrated basic principle that an assistance of crystal aligning ion beam irradiation at a specific angle of incidence during a deposition process is critical in determining the nature of crystal orientations in the grain structure developed in the thin film. The present invention is therefore to be limited only by the scope of the claims which follow.

What is claimed is:

1. A method for making a polycrystalline thin film on a metal substrate base, said polycrystalline thin film consisting essentially of a plurality of grains of a cubic crystal structure defined by a-, b- and c-axes, said polycrystalline thin film being formed such that the intergranular misorientation, defined by a range of orientation of said a-axes or said b-axes, is not more than 35 degrees, and said c-axes are perpendicular to a surface of said metal substrate base, comprising the steps of:

(a) placing said metal substrate base on a deposition vessel;

(b) depositing the constituting elements of a target material on said metal substrate base so as to form said polycrystalline thin film;

wherein during the step (b), the surface of said polycrystalline thin film being formed on said metal substrate base is irradiated with an ion beam at an oblique incidence angle to said polycrystalline thin film, wherein said oblique incidence angle is selected not less than 50 degrees and not more than 60 degrees, said metal substrate base is cooled and maintained at a temperature within the range of from −150° C. to less than +100° C., said temperature being lower than the temperature of the metal substrate base due to the depositing and the irradiation by the ion beam, and said polycrystalline thin film is selected from the group consisting of yttrium stabilized zirconia, $CeO_2$, MgO, and $SrTiO_3$.

2. The method of making a polycrystalline thin film as claimed in claim 1, wherein said metal substrate base is a metallic tape.

3. The method of making a polycrystalline thin film as claimed in claim 2, wherein said metallic tape is Hastelloy tape.

4. The method of making a polycrystalline thin film as claimed in claim 1, wherein a method for said depositing is vapor deposition.

5. The method of making a superconducting oxide thin film as claimed in claim 4, wherein said vapor deposition is selected from the group consisting of sputtering, laser deposition and electron beam deposition.

6. A method of making a superconducting oxide thin film on a polycrystalline thin film consisting essentially of a plurality of grains of a cubic crystal structure defined by a-, b- and c-axes on a metal substrate base, said polycrystalline thin film is formed such that an intergranular misorientation, defined by a range of orientations of said a-axes or said b-axes is not more than 35 degrees, and said c-axes are perpendicular to a surface of said metal substrate base, comprising the steps of:

(a) placing said metal substrate base on a deposition vessel;

(b) depositing the constituting elements of a target material on said metal substrate base so as to form said polycrystalline thin film;

(c) depositing said superconducting oxide thin film on said polycrystalline thin film;

wherein during the step (b), the surface of said polycrystalline thin film being formed on said metal substrate base is irradiated with an ion beam at an oblique incidence angle to said polycrystalline thin film, said oblique incidence angle is selected to be not less than 50 degrees and not more than 60 degrees, said metal substrate base is cooled and maintained at a temperature within the range of from −150° C. to less than +100° C., said temperature being lower than the temperature of the metal substrate base due to the depositing and the irradiation by the ion beam, and wherein said polycrystalline thin film is selected from the group consisting of yttrium stabilized zirconia, $CeO_2$, MgO, and $SrTiO_3$.

7. The method of making a superconducting oxide thin film as claimed in claim 6, wherein said metal substrate base is a metallic tape.

8. The method of making a superconducting oxide thin film as claimed in claim 7, wherein said metallic tape is Hastelloy tape.

9. The method of making a superconducting oxide thin film as claimed in claim 6, wherein said depositing is vapor deposition.

10. The method of making a superconducting oxide thin film as claimed in claim 9, wherein said vapor deposition is selected from the group consisting of sputtering, laser deposition and electron beam deposition.

\* \* \* \* \*